United States Patent [19]
Cipolla et al.

[11] Patent Number: 5,208,729
[45] Date of Patent: May 4, 1993

[54] MULTI-CHIP MODULE

[75] Inventors: Thomas M. Cipolla, Katonah; Paul W. Coteus; Glen W. Johnson, both of Yorktown Heights; Lawrence S. Mok, Brewster, all of N.Y.

[73] Assignee: International Business Machines Corporation, Armonk, N.Y.

[21] Appl. No.: 836,672

[22] Filed: Feb. 14, 1992

[51] Int. Cl.$^5$ ............................................. H05K 7/20
[52] U.S. Cl. ........................... 361/382; 165/80.3; 361/396; 361/413; 439/77
[58] Field of Search ........................... 361/382–389, 361/396, 398, 401, 412, 413, 414, 415, 429; 165/80.3, 104.33; 357/81, 82; 62/418; 439/67, 69, 74, 76, 77, 329

[56] References Cited

U.S. PATENT DOCUMENTS

| | | | |
|---|---|---|---|
| 3,372,310 | 3/1968 | Kantor | 317/101 |
| 3,671,812 | 6/1972 | Peluso et al. | 317/118 |
| 3,991,347 | 11/1976 | Hollyday | 317/101 |
| 4,107,760 | 8/1978 | Zimmer | 361/383 |
| 4,122,508 | 10/1978 | Rumbaugh | 361/384 |
| 4,291,364 | 9/1981 | Andros et al. | 361/384 |
| 4,315,300 | 2/1982 | Parmerlee et al. | 361/382 |
| 4,339,628 | 7/1982 | Marcantonio | 361/396 |
| 4,375,290 | 3/1983 | Zucchi et al. | 277/12 |
| 4,423,468 | 12/1983 | Gatto | 361/396 |
| 4,549,200 | 10/1985 | Ecker et al. | 357/80 |
| 4,580,193 | 4/1986 | Edwards | 361/407 |
| 4,619,316 | 10/1986 | Nakayama et al. | 165/104.33 |
| 4,674,004 | 6/1987 | Smith et al. | 361/384 |
| 4,730,232 | 3/1988 | Lindberg | 361/381 |
| 4,739,444 | 4/1988 | Zushi et al. | 361/383 |
| 4,771,366 | 9/1988 | Blake et al. | 361/387 |
| 4,782,381 | 11/1988 | Ruby et al. | 357/74 |
| 4,783,695 | 11/1988 | Eichelberger et al. | 357/65 |
| 4,830,264 | 5/1989 | Bitaillou et al. | 228/180.2 |
| 4,831,433 | 5/1989 | Ogura et al. | 357/68 |
| 4,835,344 | 5/1989 | Iyogi et al. | 174/68.5 |
| 4,838,475 | 6/1989 | Mullins et al. | 228/179 |
| 4,841,355 | 6/1989 | Parks | 357/82 |
| 4,868,634 | 9/1989 | Ishida et al. | 357/68 |
| 4,956,746 | 9/1990 | Gates, Jr. | 361/382 |
| 5,023,754 | 6/1991 | Aug | 361/412 |
| 5,027,505 | 7/1991 | Nakamura | 361/412 |
| 5,057,971 | 10/1991 | Hautvast | 361/395 |
| 5,101,322 | 3/1992 | Ghaem | 361/413 |

FOREIGN PATENT DOCUMENTS

3739985A1  6/1988  Fed. Rep. of Germany.

OTHER PUBLICATIONS

M. E. Ecker, "Inrterface for Thermal Exchange Devices", IBM Technical Disclosure Bulletin, vol. 10, No. 7, Dec. 1967, p. 943.

*Primary Examiner*—Gerald P. Tolin
*Attorney, Agent, or Firm*—Perman & Green

[57] ABSTRACT

A high density package for a plurality of integrated circuit chips is described, the package including a number of planar subunits. A subunit includes first and second planar metal plates and a spacer metal plate sandwiched therebetween. Each spacer metal plate is provided with a plurality of circuit-receiving apertures. A planar circuit carrier is provided for each aperture in the spacer metal plate. One face of each circuit carrier includes a plurality of bonded chips. Each circuit carrier is positioned in a circuit-receiving aperture so that rear aspects of the bonded chips bear upon the second planar metal plate. Each circuit carrier has a connector region which extends out from between the first planar metal plate and the metal spacer plate at one extremity of each circuit-receiving aperture. A circuit card is positioned at that extremity and has a plurality of interconnection areas, one for each extended connector region. The circuit card has its major surface oriented parallel to the metal plates so that the entire package presents an overall planar configuration.

26 Claims, 10 Drawing Sheets

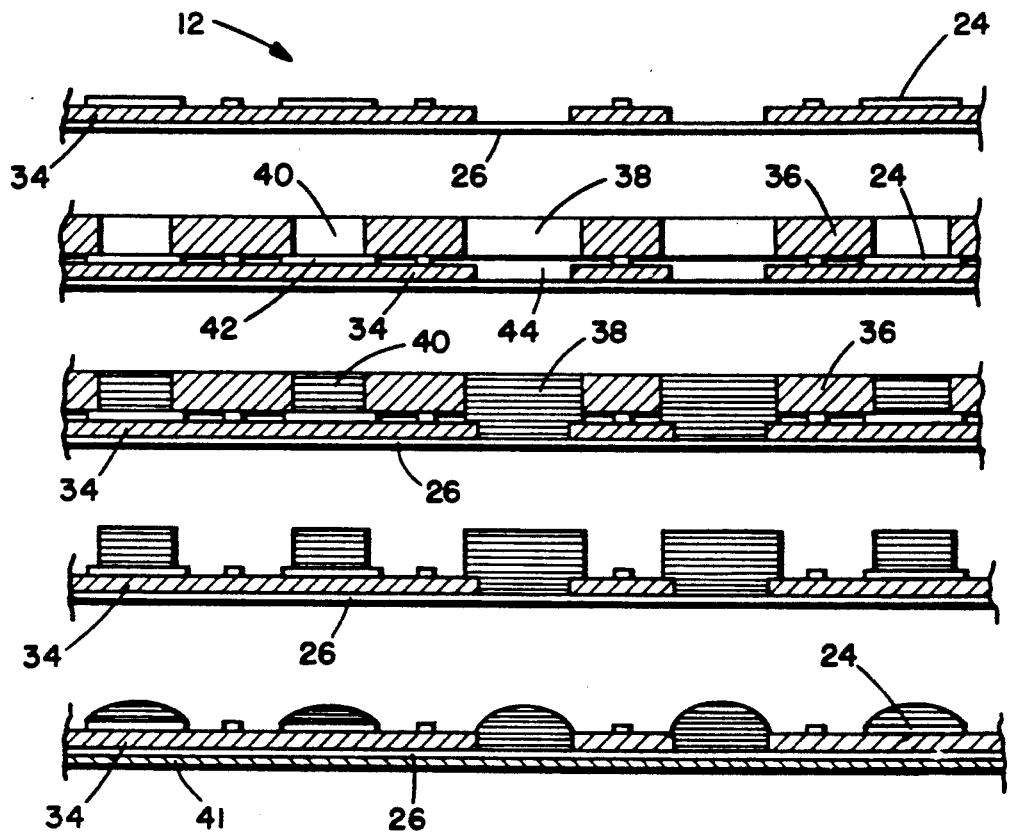
FIG. 3A.
FIG. 3B.
FIG. 3C.
FIG. 3D.
FIG. 3E.
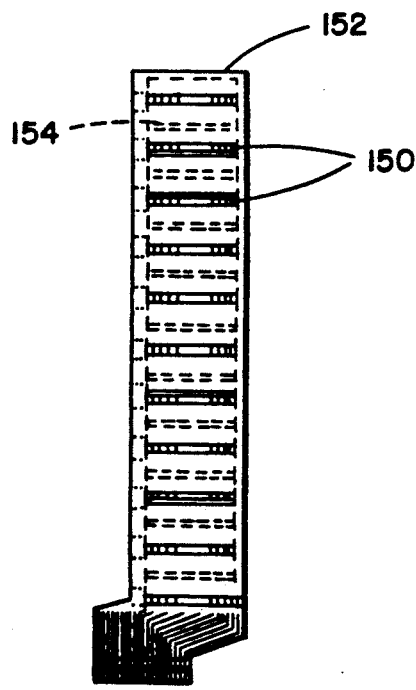
FIG. 9.

MULTI-CHIP MODULE

CROSS REFERENCE TO RELATED APPLICATION

This application is related to "High Density, High Performance Memory Circuit Package", Ser. No. 07/922,257 of T. M. Cipolla et al, which is hereby incorporated by reference.

FIELD OF THE INVENTION

This invention relates to microelectronic packaging and, more particularly, to a high density, multi-chip package having improved heat dissipation characteristics.

BACKGROUND OF THE INVENTION

To reap the benefits of increased component densities in memory chips, it is necessary to increase the packing density of the package which holds the memory chips. This is especially so with respect to the highest density, dynamic random access memory chips (DRAM's) now commercially available. DRAM chips have traditionally been packaged as single chip modules. That is, a single silicon die has been wire bonded to a lead frame containing wiring that fans out the necessary signals to and from the chip via a set of individual metal leads. Those leads are then connected to an underlying circuit board. The lead frame and silicon chip are usually encased in an epoxy block, from which the individual metal leads extend, such package generally being referred to as a wire bond package.

Once the chips have been packaged, they are subjected to a process known as burn-in, whereby they are operated for many hours at elevated temperatures and voltages. Packaged chips which survive the burn-in operation are then assembled into groups of chips which, in turn, are assembled into groups of groups, etc. Additionally, other components of the memory system such as control logic, error correction logic, etc., are added to the package. Characteristically, such packaging results in large and cumbersome systems which are not suitable for the highest performance DRAM memories.

A preferred method for interconnecting DRAM chips is via a flexible, thin, insulating carrier that is provided with personalized conductive layers on its opposing surfaces. Such packaging is inherently inexpensive and lends itself, readily, to automated bonding processes. Preferably, via-holes are to be avoided in such flexible carriers as they add unnecessary expense. However, when bonding chips in a face-down configuration, where the chips employ convex interconnection bumps, some method must be provided to enable communication to the conductive layer that is present on the far side of the insulating carrier.

Significant care must be taken in such packaging environments to enable high efficiency cooling of such packages. The prior art is replete with designs for high density packaging. Examples of some of these prior art teachings can be found in the following patents. In U.S. Pat. No. 4,730,232 to Lindberg, a pair of device-containing circuit boards are laminated to planar heat sinks, which heat sinks are mounted back-to-back and are enclosed within a pair of covers. In U.S. Pat. No. 4,122,508 to Rumbaugh, a separate heat sink is attached to each of a plurality of printed circuit boards, each heat sink having a plurality of fins integrally formed therein. When a number of these heat sinks are mounted on a face to face basis, continuous air circulation paths are formed that enable cooling of the attached circuit boards.

In U.S. Pat. No. 4,771,366 to Blake et al., a plurality of parallel-oriented ceramic card assemblies with interspersed cold plates are described. Each ceramic card has a number of chips mounted on both of its sides, which chips are enclosed by conductive caps that, in turn, bear upon the cold plates. In U.S. Pat. No. 4,841,355 to Parks, a high density package is shown having internal pathways for a liquid coolant flow. In U.S. Pat. No. 3,372,310 to Kantor, a high density package is shown wherein a plurality of chips are mounted on a substrate, an apertured spacer emplaced thereover, and the entire configuration is enclosed within metallic coverplates.

A number of prior art references disclose parallel-mounted circuit cards with pathways provided therebetween for cooling airflow. Such structures can be found in U.S. Pat. No. 4,107,760 to Zimmer; U.S. Pat. No. 4,674,004 to Smith et al.; U.S. Pat. No. 4,375,290 to Zucchi et al.; U.S. Pat. No. 4,291,364 to Andros et al.; U.S. Pat. No. 4,739,444 to Zushi et al.; and U.S. Pat. No. 3,671,812 to Peluso et al. Other liquid and liquid/air flow cooling systems can be found in U.S. Pat. No. 4,619,316 to Nakayama et al. and U.S. Pat. No. 4,315,300 to Parmerlee et al. Other multi-chip integrated circuit packaging configurations can be found in the following patents: U.S. Pat. No. 4,783,695 to Eichelberger et al.; U.S. Pat. No. 4,580,193 to Edwards; U.S. Pat. No. 4,549,200 to Ecker et al.; U.S. Pat. No. 4,868,634 to Ishida et al.; U.S. Pat. No. 4,831,433 to Ogura et al.; and U.S. Pat. No. 4,782,381 to Ruby et al.

The following patents describe methods for providing via-connections to opposite sides of a circuit board: U.S. Pat. No. 4,830,264 to Bitaillou et al.; U.S. Pat. No. 3,991,347 to Hollyday; U.S. Pat. No. 4,835,344 to Iyogi et al.; U.S. Pat. No. 4,838,475 to Mullins et al.; German patent DE 37 39 985 A1 to Inoue et al. and IBM Technical Disclosure Bulletin, Vol. 10, No. 7, December 1967 (Ecker) p. 943.

SUMMARY OF THE INVENTION

It is an object of this invention to provide an improved, high density, electronic package capable of handling high levels of power dissipation.

It is another object of this invention to provide a high density electronic package that is adapted to contain a plurality of different types of basic circuit packages.

It is still another object of this invention to provide a high density electronic package that may be efficiently cooled.

It is a further object of this invention to provide an improved, high density, electronic package that efficiently conducts internally generated heat to its external surfaces for dissipation.

It is yet another object of this invention to provide a high density electronic package that employs low inductance wiring and exhibits improved electromagnetic shielding.

A high density package for a plurality of integrated circuit chips is described, the package including a number of planar subunits. A subunit includes first and second planar metal plates and a spacer metal plate sandwiched therebetween Each spacer metal plate is provided with a plurality of circuit-receiving apertures. A planar circuit carrier is provided for each aperture in the spacer metal plate. One face of each circuit carrier includes a plurality of bonded chips. Each circuit carrier is positioned in a circuit-receiving aperture so that rear aspects of the bonded chips bear upon the second planar metal plate. Each circuit carrier has a connector region which extends out from between the first planar metal plate and the metal spacer plate at one extremity of each circuit-receiving aperture. A circuit card is positioned at that extremity and has a plurality of interconnection areas, one for each extended connector region. The circuit card has its major surface oriented parallel to the metal plates so that the entire package presents an overall planar configuration.

DESCRIPTION OF THE DRAWINGS

FIG. 3a–e show the steps in a process for providing solder connectors on the planar circuit carrier.

FIG. 9 is a planar view of the rear aspect of a planar circuit carrier after chips have been emplaced thereon.

DETAILED DESCRIPTION OF THE INVENTION

Figure 1:
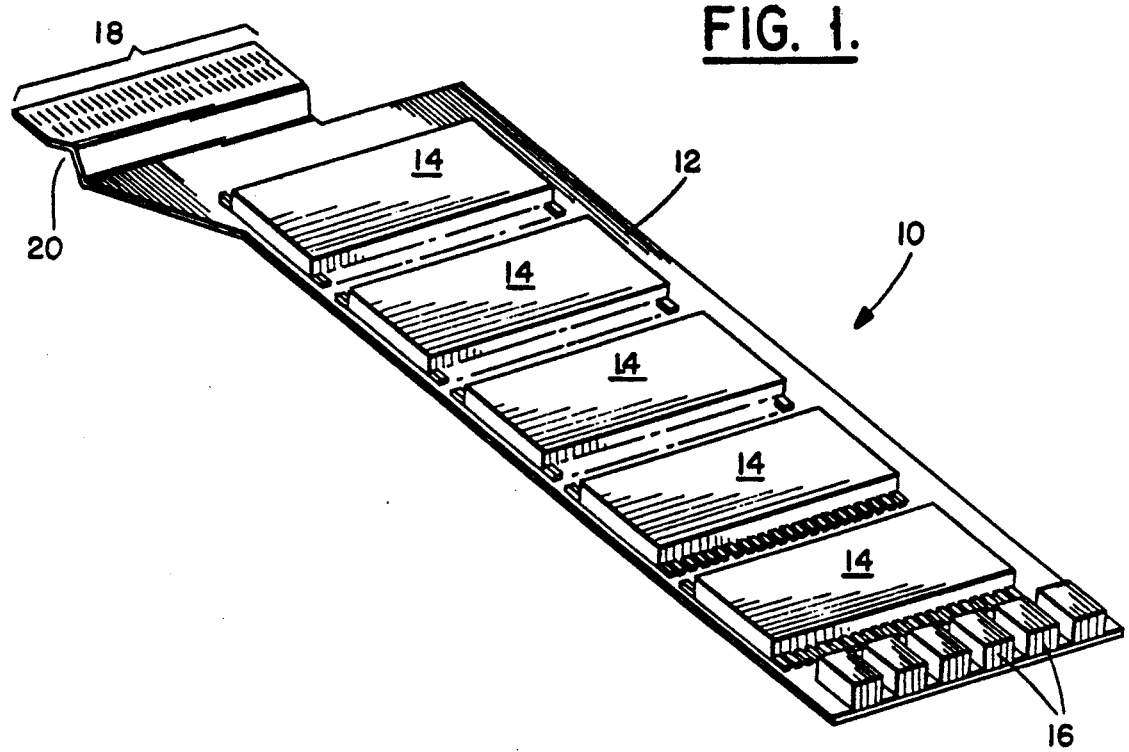
FIG. 1 is a perspective view of a planar circuit carrier having a plurality of packaged IC chips and decoupling capacitors mounted thereon.

Referring now to FIG. 1, a perspective view is shown of a multi-chip, thin film, planar circuit carrier 10. Hereinafter, the invention will be described in the context of a DRAM package. However, it is to be understood that the package concepts described herein are equally applicable to other integrated circuit applications.

Circuit strip 10 comprises a thin film circuit carrier 12 which is provided with metalization on both of its sides. A plurality of DRAM chips 14 are mounted on one side of circuit carrier 12, as are a plurality of surface-mount decoupling capacitors 16. At one extremity of circuit carrier 10 is a connector region 18 that is offset to one side of the main axis of circuit carrier 12 and is also bent upwardly by a bend at region 20. As will be hereinafter understood, other circuit strips 10 are provided with identical connector regions 18 which are offset to the other side of the main axis of circuit carrier 12. Thus, when circuit strips are packaged in a stacked manner, the first strip in the stack will have its connector region offset to one side of the main axis, whereas the second strip will have its connector region offset to the other side, so that both connector regions can make contact to differing areas of the same side of a circuit board and not overlap one another.

Figure 2:
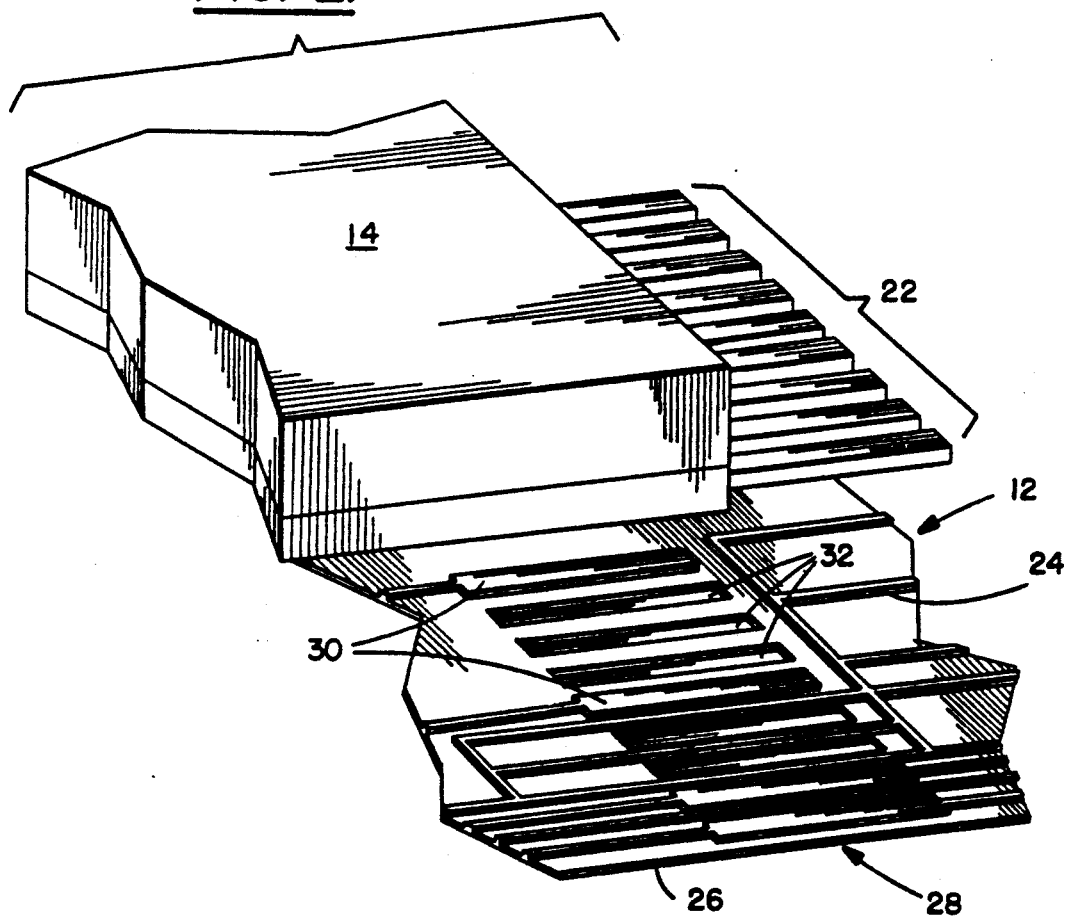
FIG. 2 is an exploded view of a portion of one integrated circuit chip and an underlying planar circuit carrier.

In FIG. 2, a perspective view of circuit strip 10 is shown with a DRAM package 14 removed therefrom. Each of beam leads 22 from package 14 connects to an underlying region on flexible circuit carrier 12. Circuit carrier 12 has metalization on both of its sides, with one side (e.g. 24) being "personalized" in accordance with required circuit details and metalization layer 26, on the opposite side, being substantially continuous as a ground plane.

When DRAM package 14 is registered with a contact pattern 28 on circuit carrier 12, some of beam leads 22 will make contact with upper metalization land areas 30, while others will make contact with lower metalization layer 26, through via-holes 32. To assure proper interconnection is made therewith, flexible circuit carrier 12 has deposited thereon solder bumps which provide a planar surface for contact to beam leads 22.

Referring to FIG. 3, the process for applying such solder bumps is shown in views a–e. As shown in FIG. 3(a), flexible circuit carrier 12 comprises an upper, personalized, metalization layer 24 and a lower continuous ground plane layer 26. The two layers are separated by a polymer layer 34. To provide planar solder bumps, a solder mask 36 (FIG. 3b) is emplaced over the upper surface of flexible circuit carrier 12. Each of openings 38 and 40 in solder mask 36 have their size precalculated, in conjunction with the solder receiving volumes communicating therewith, so that after reflow, all solder bumps will be of approximately the same height. Thus, opening 40 does not extend across the full width of underlying circuit land 42 to control the amount of solder deposited therein, while the width of opening 38 is larger than the opening of hole 44 in polyimid layer 34, to allow more solder to be emplaced therein.

In FIG. 3(c), solder is shown having been deposited on solder mask 36 and into holes 38, 40, etc. In FIG. 3(d), the solder mask is shown having been removed, and in FIG. 3(e), the deposited solder bumps are subjected to a reflow procedure which, in accordance with the above teachings, causes the various bumps to assume a relatively uniform, planar upper surface for subsequent connection to the beam leads of a DRAM package. Ordinarily, connecting leads would be placed over the solder bumps before reflow, so that bonding could occur simultaneously. Those leads are omitted in FIG. 3.

Either before or subsequent to the above steps, an additional polyimid layer 41 (or other dielectric layer) may be emplaced over ground plane 26 to provide an insulating backing therefor.

Figure 4:
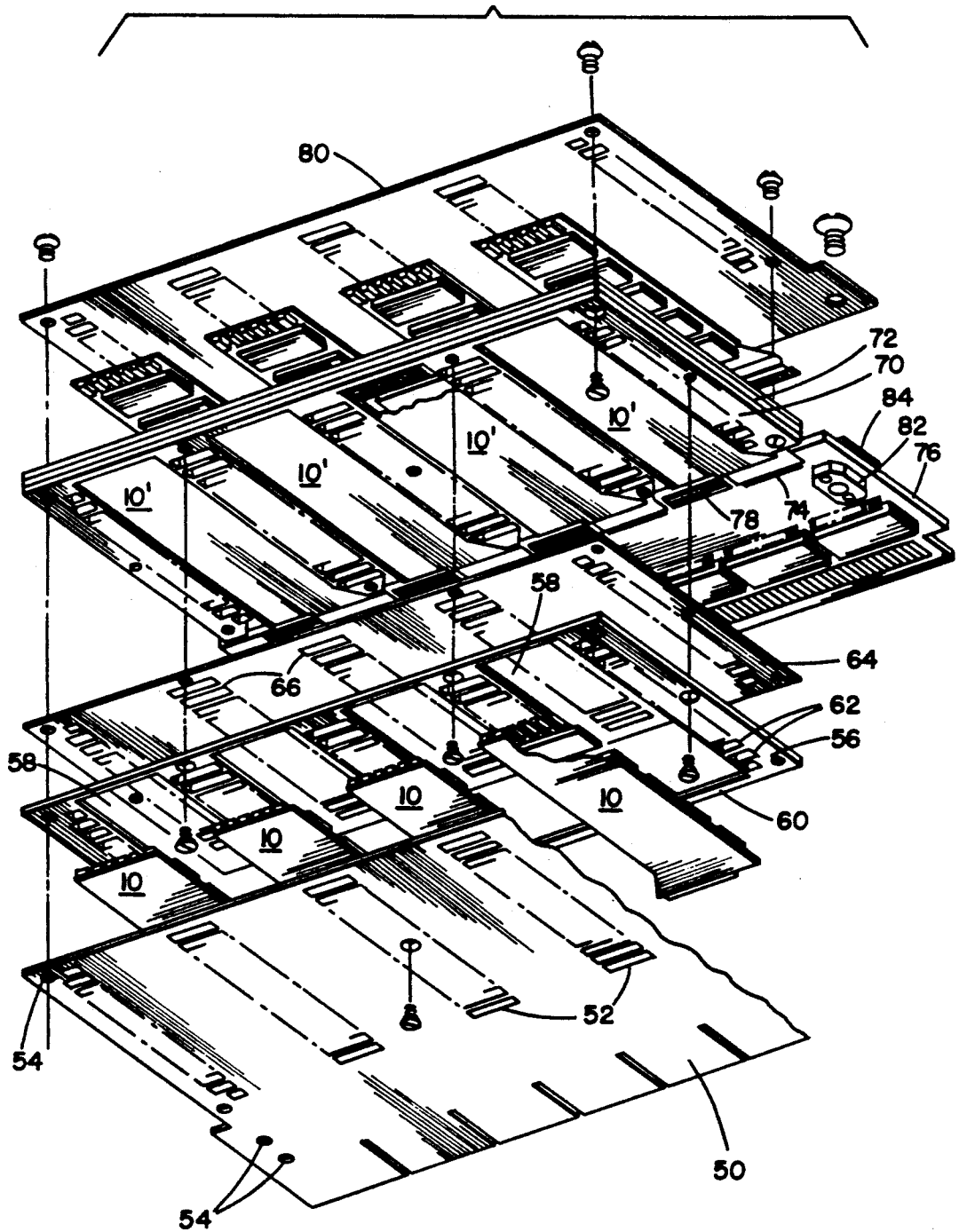
FIG. 4 is a perspective view of an exploded embodiment of the invention that provides for laminar air flow cooling.
Figure 5:
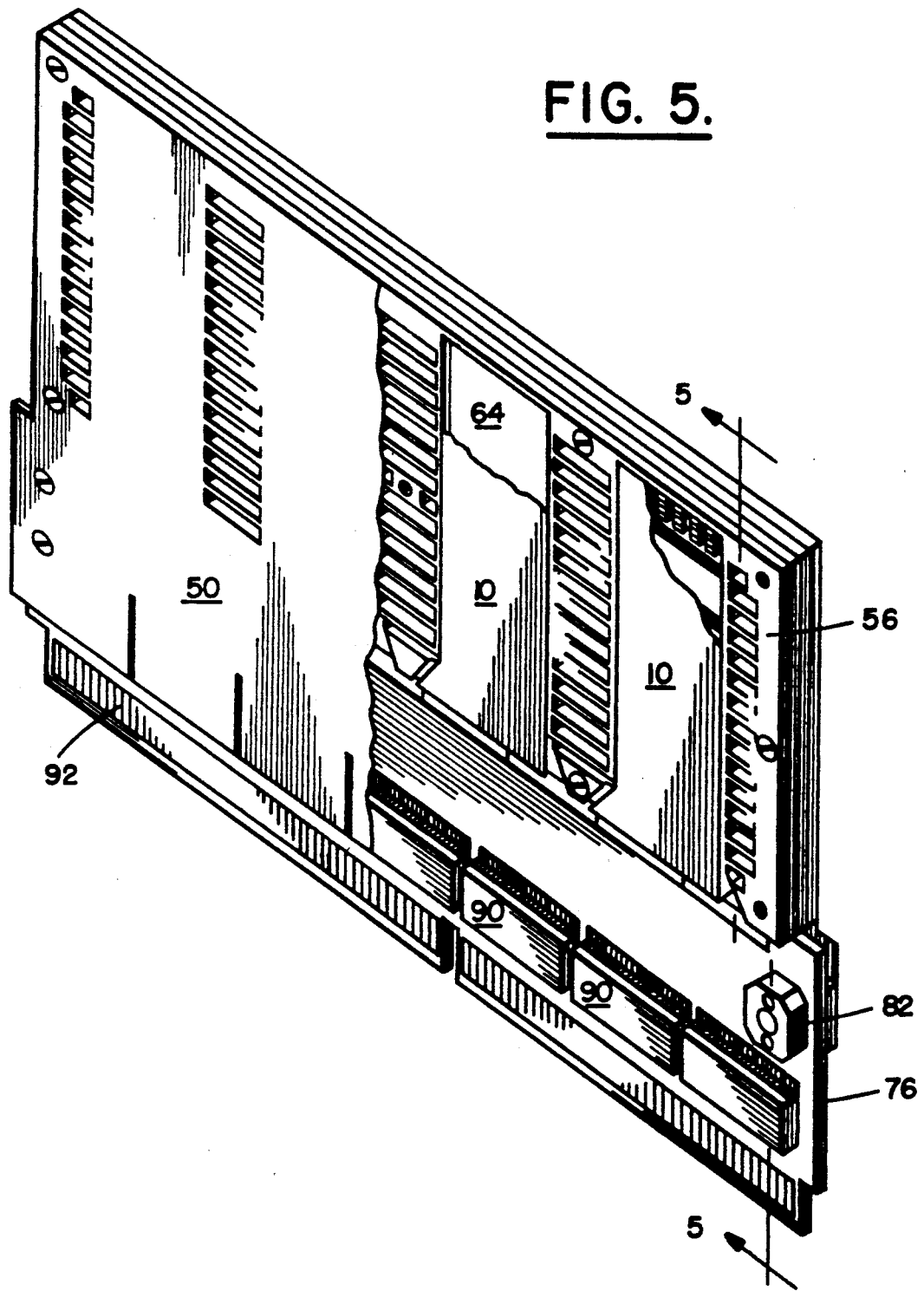
FIG. 5 is a perspective view of the assembled invention, with various parts broken away.
Figure 6:
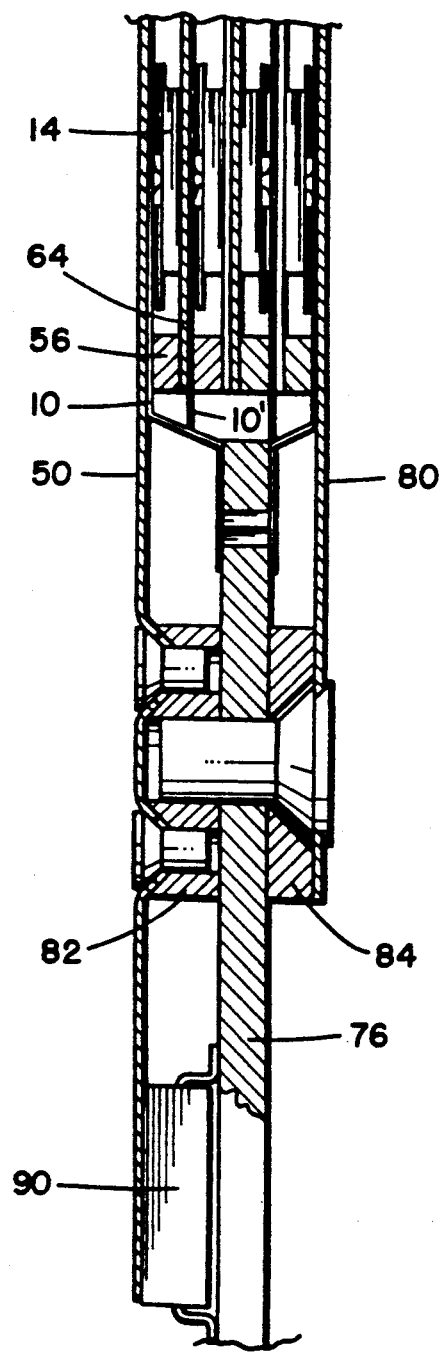
FIG. 6 is a sectional view of FIG. 5 taken along line 5—5.

Referring now to FIGS. 4, 5, and 6, the incorporation of a plurality of assembled, flexible circuit strips 10 into a heat-sinked package embodying the invention is shown. Referring first to FIG. 4, the various portions of the package will be described starting with the coverplate at the lower left of FIG. 4 and proceeding to the opposing coverplate of the upper right of FIG. 4. Initially it is to be understood that all of the cover and spacer plates to be hereinafter described are preferably composed of the same, high thermal conductivity metal. Preferred materials are copper and aluminum.

Coverplate 50 has a plurality of airflow passages 52 formed therein. Additionally, a plurality of screw holes 54 enable screws to be inserted to hold the package together. Four flexible circuit strips 10, each one holding five DRAM memory chips and associated decoupling capacitors are positioned within apertures in spacer plate 56. Spacer plate 56 is provided with four circuit-receiving apertures 58, each one adapted to receive a thin film circuit strip 10. At the bottom of each aperture 58, a portion of spacer plate 56 is thinned so as to provide a space 60 where the connector region of flexible circuit strip 10 can exit when cover plate 50 is in place. Spacer plate 56 is provided with a plurality of airflow apertures 62 which mate with apertures 52 in cover plate 50. A second cover plate 64 abuts the right side of spacer plate 56 and is also provided with mating airflow passages 66.

Cover plates 50, 64, spacer plate 56, and circuit strips 10 provide a basic subunit of the package. Initially, cover plate 64 is placed beneath spacer plate 56, and then each of circuit strips 10 is laid in a mating aperture 58. The thickness of spacer plate 56 is made approximately equal to the thickness of circuit strips 10 (along with their mounted components). Thus, when cover plate 50 is assembled onto the left face of spacer plate 56, physical contact occurs between the rear aspects of each of circuit strips 10 and solid surface areas of cover plate 50. The frontal aspects of each of the circuit components on circuit strip 10 contact the solid surface areas of the left side of cover plate 64. As an alternative, a thin sheet of an elastomeric material can be placed behind each circuit strip 10, so that when the package is assembled, the material is compressed and forces the frontal aspects of the circuit components against cover plate 64. Each of the airflow passages in the respective cover plates and spacer plate align with each other and create a smooth, continuous through-passage for airflow. Since each of these passages is continuous, the airflow therein will be laminar and non-turbulent at relatively low flow rates.

Once a basic subunit of the package has been assembled, a next subunit is constructed immediately adjoining the first subunit. Referring to FIG. 4, a plurality of circuit strips 10' are emplaced in mating apertures within an additional spacer plate 70. Immediately adjacent the right side of spacer plate 70 is another cover plate 72. It is to be noted that the connector portions of circuit strips 10' are oriented to the right side of the strips' axes, whereas the connector portions of circuit strips 10 are oriented to the left. Thus, connector portions on circuit strips 10' make connection to interconnection lands 74 on circuit board 76, whereas connector portions of circuit strips 10 make connection with interconnection lands 78 on circuit board 76.

To assemble one side of the circuit package, cover plate 50, spacer plate 56, cover plate 64 spacer plate 70 and cover plate 72 are abutted, one against another and are screwed together, with circuit strips 10 and 10' in place. An identical mirror-image package is then assembled and abutted to the aforesaid package. Interconnections are then made to circuit board 76 (preferably in the manner described in the above referenced copending application of T. M. Cipolla et al, Ser. No. 07/922257) and opposed coverplates 50 and 80 are fastened to abutments 82 and 84 on circuit board 76 to complete the assembly of the package. The above assembly procedure is merely exemplary and other assembly sequences may be substituted, depending upon the sophistication of the assembly tooling.

Turning to FIG. 5, the completely assembled package is shown with portions of coverplate 50 and circuit strips 10 removed to show internal details. A plurality of decoding or other logic circuits 90 are mounted on circuit board 76 and make interconnection with circuit carriers 10, 10' etc. through wiring (not shown) on and within circuit board 76. A plurality of pluggable land areas 92 provide interconnection to circuit board 76 when the package is plugged into a "mother board". In FIG. 6, a sectional view of FIG. 5 is shown taken along line 5—5.

Figure 7:
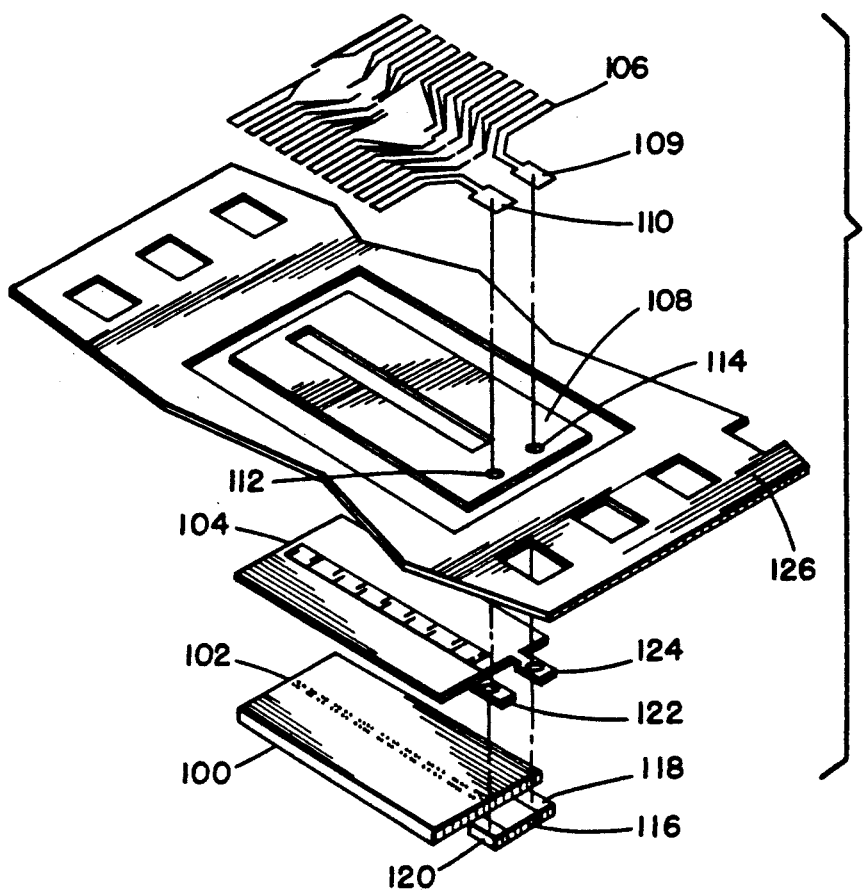
FIG. 7 is an exploded view illustrating the interconnection of an integrated circuit package to a planar circuit carrier

Turning now to FIG. 7, details are illustrated of an interconnection technique between a decoupling capacitor, circuit strip and a memory chip module that exhibits very low inductance. The exploded view shows how connections are made to input/output pins 102 located along the centerline of chip module 100. Two layers of wiring 104 and 106 are separated by an insulating sheet 108 that is part of tape 126. The top surface wiring 106 contains all of the signal lines for chip module 100, as well as power and ground taps 109 and 110 respectively. The bottom surface wiring 104 is used for power and ground distribution. Electrical contact is made between the power and ground taps 109 and 110 and the power and ground distribution lines, respectively, on the bottom surface wiring 104 through a pair of via holes 112 and 114 in insulating sheet 108.

Electrical contact between the wiring layers is made through the use of a surface mount decoupling capacitor 116 whose contact regions 118 and 120 have a paste solder applied When the package is subsequently heated to reflow the solder, the solder bonds capacitor 116 to pads 122 and 124. In addition, since each of pads 122 and 124 is provided with a through-hole, the solder flows up therethrough, through holes 112 and 114 in sheet 108 and bonds to upper wiring bonding pads 109 and 110. Subsequently, the thus-bonded chip/capacitor structure may be separated from tape 126 and applied to a circuit carrier 12, as shown in FIG. 1. The same structure and procedure may be applied to circuit carrier 12 (instead of tape 126) so that the above-described interconnections are made at the same time chip-to-carrier reflow occurs.

Figure 8:
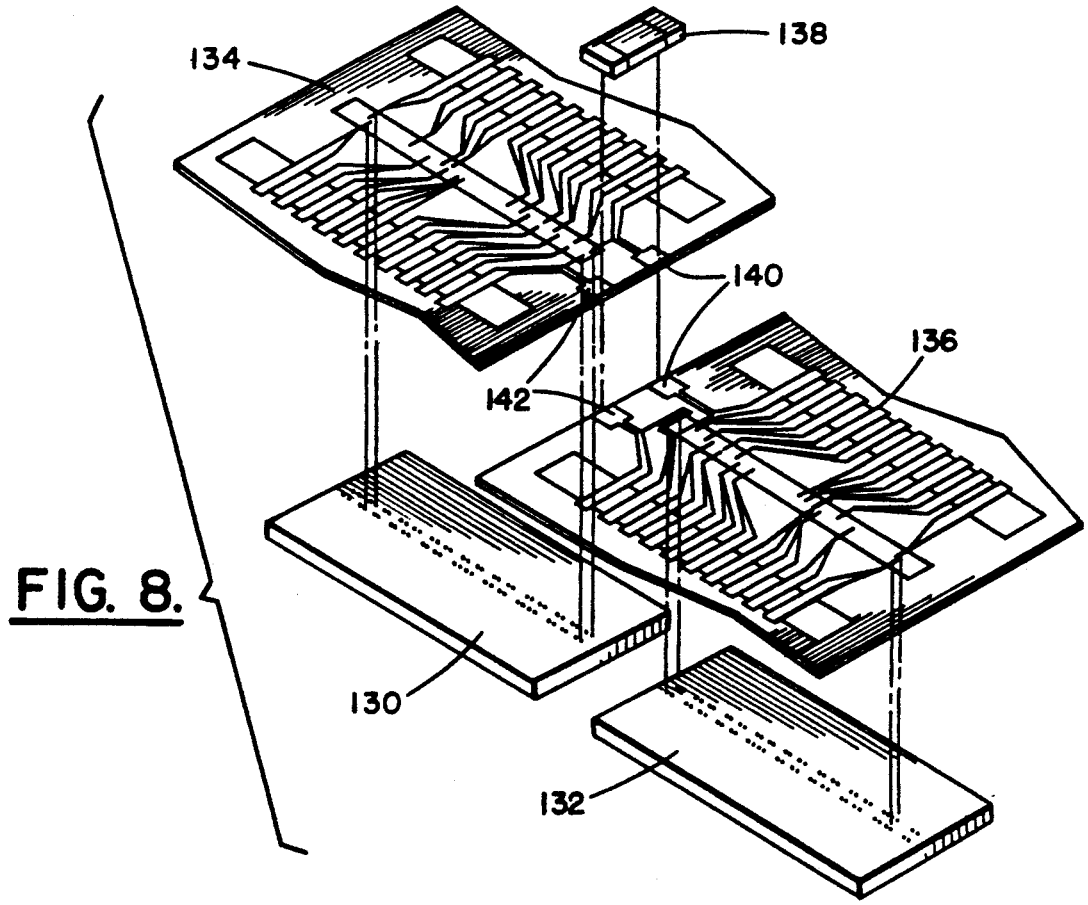
FIG. 8 is an exploded view indicating how a pair of integrated circuit packages can be interconnected to a planar circuit carrier and share a single decoupling capacitor.

Referring to FIG. 8, a pair of DRAM chip modules 130 and 132 may be mounted on adjoining lead frames 134 and 136 respectively. Here, however, capacitor 138 is connected to adjacent bonding pads 140 and 142 to form a bridge therebetween. Thus, capacitor 138 can be common to modules 130 and 132 since they do not operate at the same time. Except as necessary for lead connection to chips 130, 132, frames 134 and 136 are substantially mirror images of each other. The two wiring halves (left and right) are thus joined by bonding pads 134 and 136, both electrically and mechanically, to the common decoupling capacitor through the bonding solder.

Turning now to FIG. 9, a rear view of an 11-chip flexible circuit strip 152 is shown. An opening 150 is provided in circuit strip 152 immediately beneath the central input/output contacts on the bottom of each DRAM chip 154. Apertures 150 are provided to enable a hot air blast to be directed at the contact region so as to enable solder reflow therein. Subsequent to solder joining, an encapsulant is placed within apertures 150 to create a seal and to prevent solder fatigue.

Figure 10:
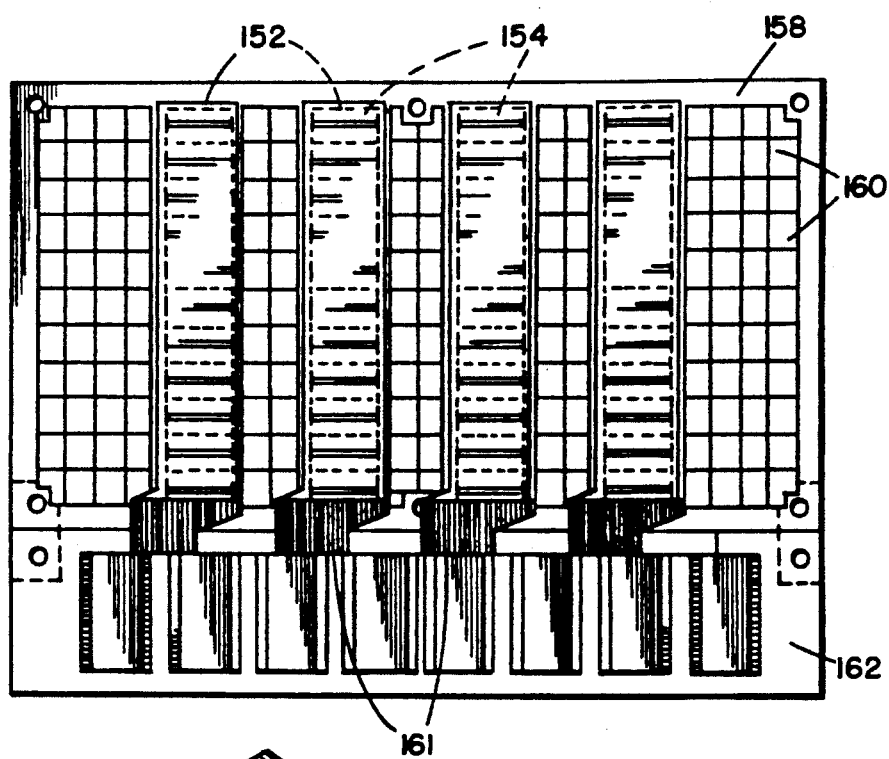
FIG. 10 is a plan view of a face of a high density package for containing a plurality of the circuit carriers of FIG. 9, with an outermost cover plate having been removed.

With an 11-high package such as shown in FIG. 9, more efficient cooling is desired in the package. This is achieved by constructing the package in a form that enables turbulent airflow therethrough. In FIG. 10, a plan view is shown of four circuit strips 152 that are mounted so that the uppermost surfaces of hidden chip modules 154 bear upon cover plate 158. Cover plate 158 has a multiplicity of airflow holes 160. Connector regions 161 of circuit strips 152 connect to interconnection lands on multilayer printed circuit board 162.

Figure 11:
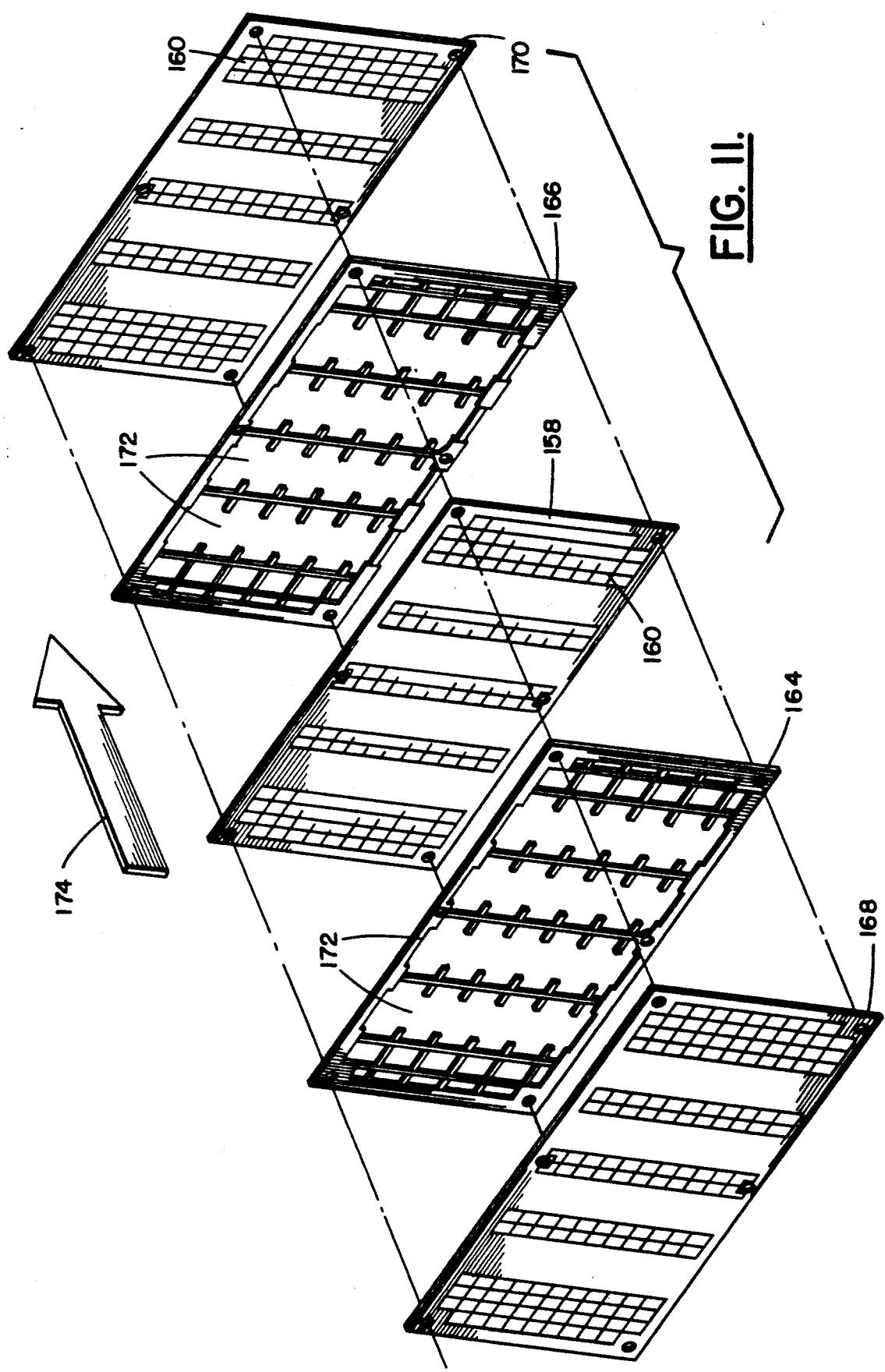
FIG. 11 is an exploded view of the various planar plates that are employed in the package shown in FIG. 10 to enable a turbulent airflow to be achieved for cooling purposes.

In FIG. 11, the remainder of the circuit package is shown in exploded form, with circuit strips 152 and circuit board 162 removed. It is to be noted that cover plate 158 is positioned in the middle of the package and is sandwiched between two spacer plates 164 and 166. A further pair of cover plates 168 and 170 are positioned to sandwich the entire structure therebetween. Spacer plates 164 and 166 are each provided with apertures 172 for receiving circuit strips 152. However, spacer plates 164 and 166 are largely skeletal and their apertures for airflow are not directly aligned with apertures 160 in the respective coverplates. As a result, when air is caused to flow through apertures 160 in the direction indicated by arrow 174, turbulent airflow occurs within the interior of the package, thereby enabling higher efficiency cooling to occur of the circuit modules contained therein.

Figure 12:
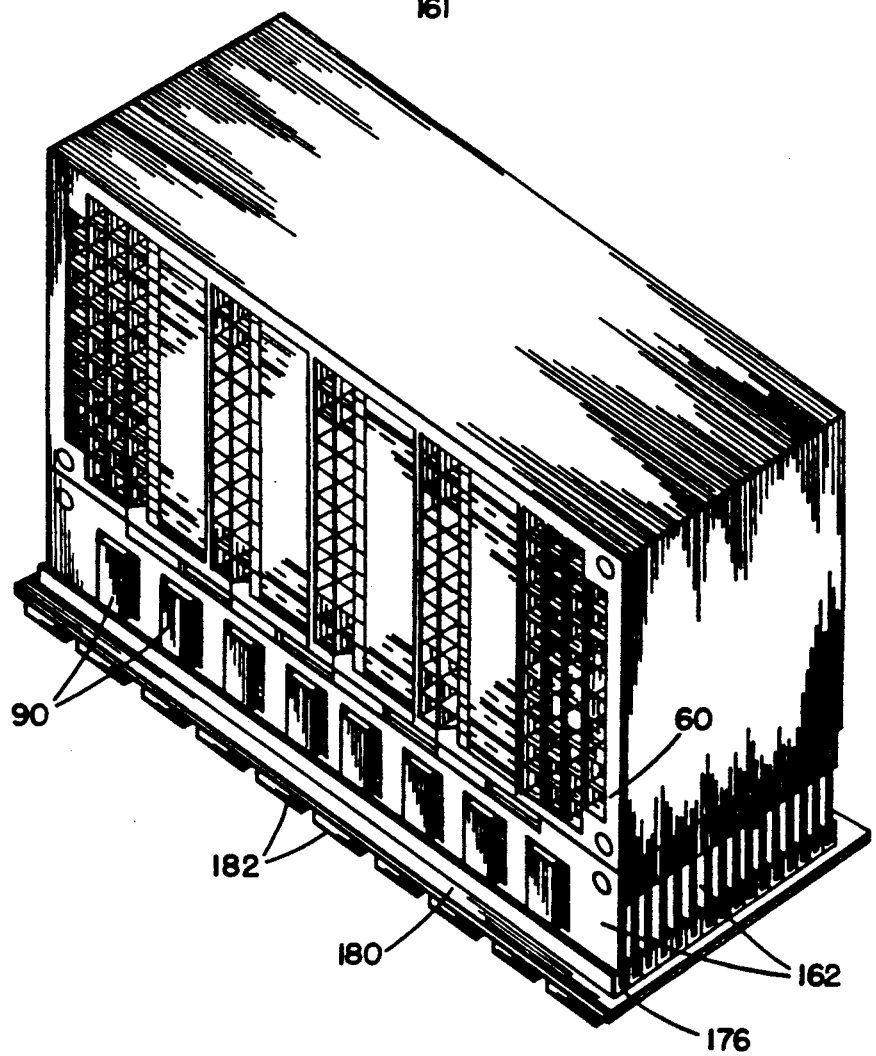
FIG. 12 is a perspective view of a fully assembled package that provides turbulent airflow, with a cover plate removed.

In FIG. 12, a completely assembled turbulent airflow package is shown with coverplate 168 and spacer 164 removed. It is to be noted that each of printed boards 162 plugs into a female connector 176 mounted on the rear of a mother board 180. Additional components 182 may be mounted on the underside of mother board 180. When coverplate 168 is in place (see FIG. 5), it extends down and contacts the upper surfaces of logic circuits 90. The heat emanating therefrom is thus conducted upwardly towards apertures 160 for dissipation. Additionally, airflow from the same source that is directed through apertures 160 can also be passed over the underside of mother board 180 to cool the components mounted thereon.

Figure 13:
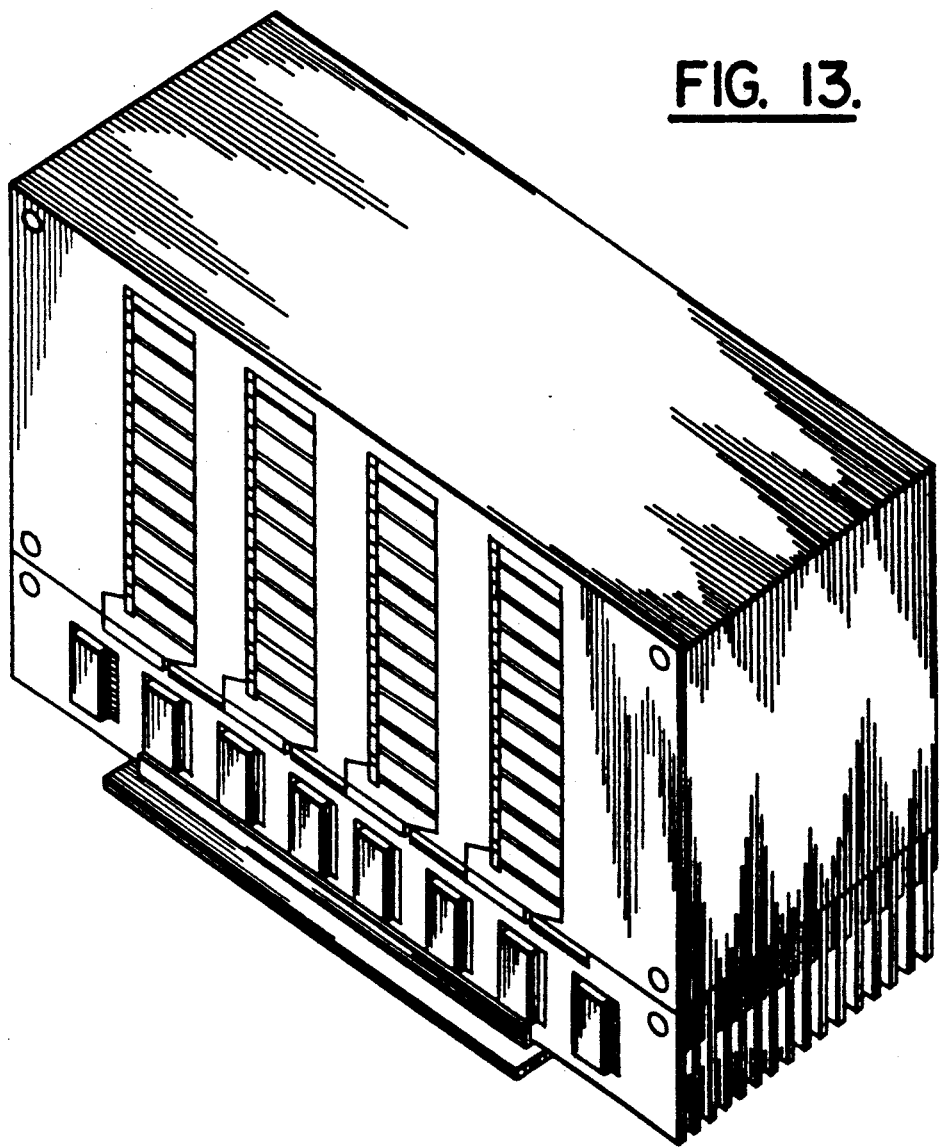
FIG. 13 is a modification of the package of FIG. 12 for lower power dissipation or contact cooling applications.

Turning now to FIG. 13, a package substantially similar to that of FIG. 12 is shown, however in this instance, the memory package is destined for use with a lower power-dissipation system. Thus, internal airflow passages are not required, and heat generated inside the package is conducted away by the cover and spacer plates to the surface of the package. Airflow across the surface of the package is then sufficient to dissipate the expended power. Otherwise, the structure of the package shown in FIG. 13 is much the same as that shown in FIG. 4.

Figure 14:
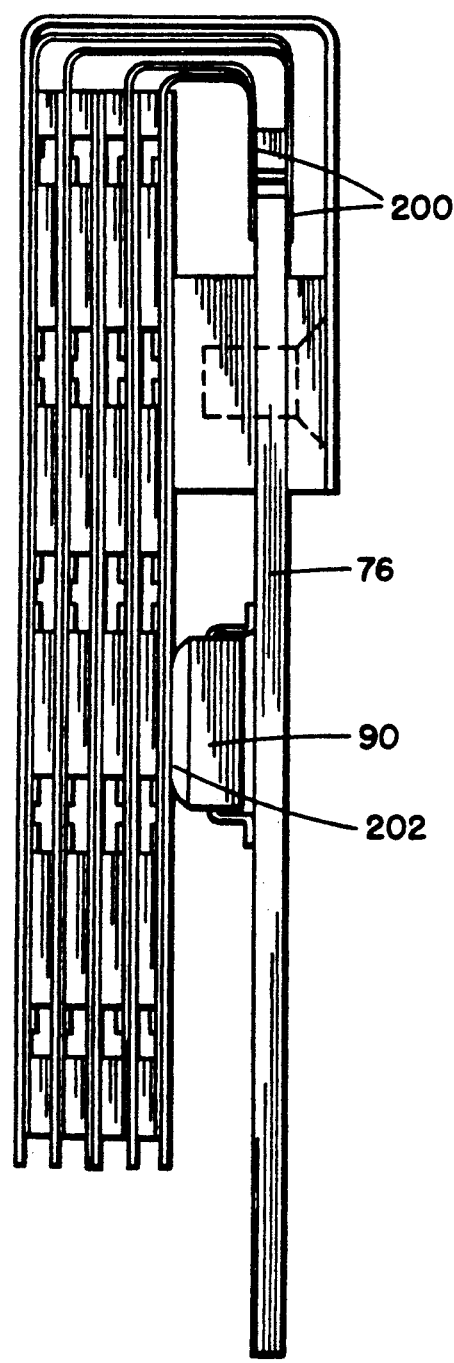
FIG. 14 shows a modification of the package of FIG. 13 to enable a lower package height to be obtained.

In FIG. 14, the circuit package of FIG. 13 has been modified to exhibit a lower overall height. Just above points of interconnection 200 to circuit board 76, the circuit strips, spacer and cover plates have been bent 180° back over circuit board 76. This enables the package to exhibit a "fatter" but lower-in-height form factor and is particularly useful for highly dense, low power dissipation package configurations. A heat conducting insert or gel 202 enables thermal contact between logic circuit 90 and a cover plate of the package. The circuit packages of FIGS. 13 and 14 are adapted for inclusion in portable equipment where forced air cooling is not available. In such equipment, the cover plate is placed in contact with the outer shell of the equipment to enhance external heat dissipation.

From the above, it can be seen that a high density circuit packaging system has been described that enables brick-like packing of circuit-containing modules on a face-to-face basis. The package, depending upon expected power dissipation, can be cooled via internal laminar airflow, internal turbulent airflow, external airflow only or other cooling mechanisms. The package exhibits excellent EMI radiation characteristics.

It should be understood that the foregoing description is only illustrative of the invention. Various alternatives and modifications can be devised by those skilled in the art without departing from the invention. For instance, while the invention has been described employing packaged chips, chips with surface passivation could be directly mounted onto the circuit strips using an appropriate face-down bonding technique.

It will be understood, that the case of computers with large DRAM based memory systems, accidental loss of power can cause considerable delay after power-up while the state of the memory is regenerated. In some cases no recovery is possible. For this reason local battery backup, to create an uninterruptable power source, is often a part of the memory design. Space near the memory system must be created which allows unimpeded airflow while the memory system is under full power. Additionally, cooling air flow should be provided for the batteries, which heat up while they are being charged. It is necessary to find a compact, integrated packaging solution.

Figure 15:
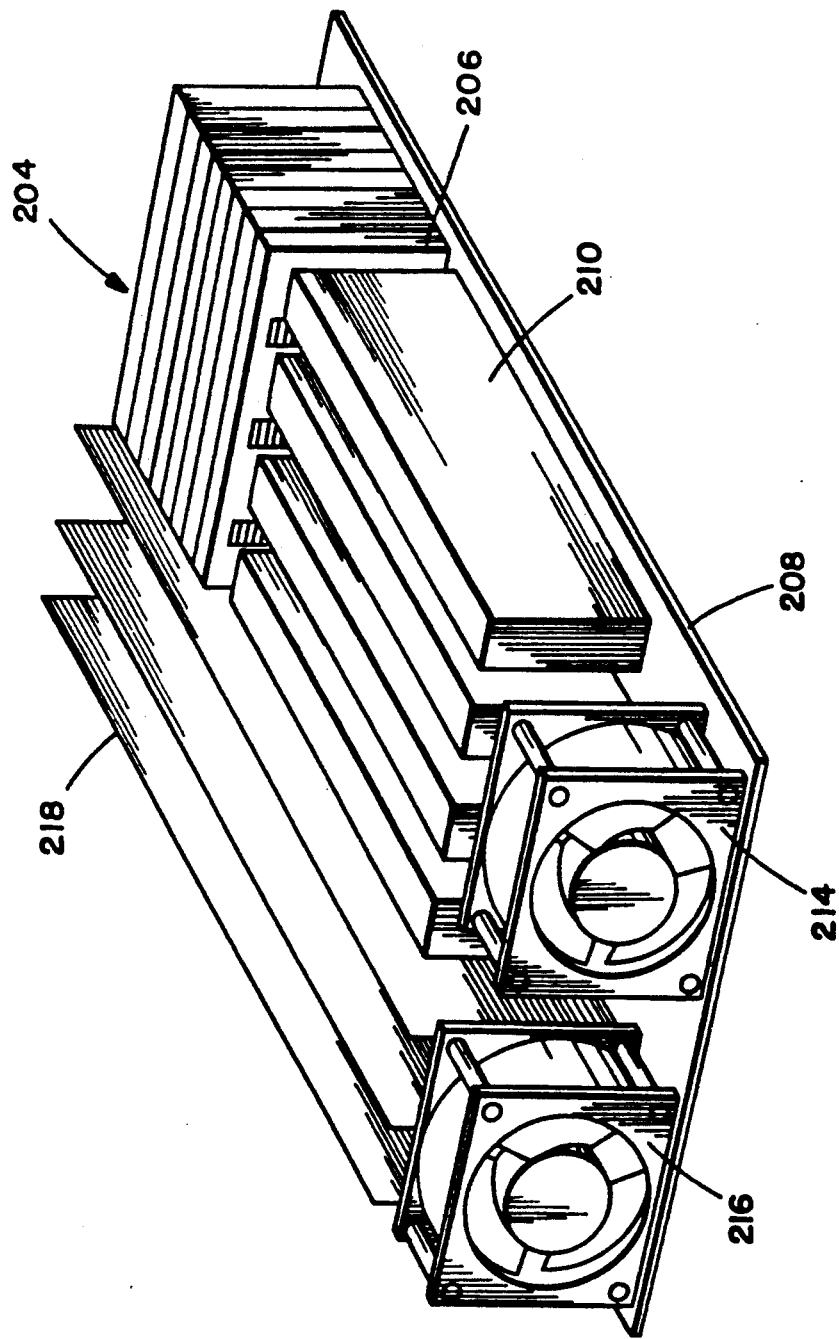
FIG. 15 shows a number of packages in accordance with the invention, arranged with other components associated with a memory system.

Referring to FIG. 15, elements of the power supply for an air cooled system are used to assist in the cooling of both the supply elements and the system devices being powered. A high density memory module 204 (including at least a plurality of packages 206, in accordance with the invention) is mounted on a base plate 208, along with a number of battery packs 210 which are arranged in an array which naturally matches the geometry of packages 206. The spaces between the battery packs 210 act as both a cooling channel for the batteries themselves, and as natural passages for the air required to cool the memory packages. The air is forced into the channels by a fan 214. The batteries can be either rectangular as shown (as is the case for certain lead-acid and Ni-Cd batteries) or stacks of cylindrical batteries which are available in a wide variety of sizes.

In the arrangement of FIG. 15, the cooling air is directed into an array of thin columns. The columns are approximately 10 mm wide while the space between columns is approximately 20 mm. These columns are aligned with air flow openings in the packages.

A separate fan 216 may be used to provide cooling to associated circuit boards 218 having control circuits thereon.

The present invention is intended to embrace all alternatives, modifications and variances which fall within the scope of the appended claims.

We claim:
1. A high density package for a plurality of integrated circuit chips, the combination comprising:
    first and second planar metal plates;

a spacer metal plate sandwiched between said first and second planar metal plates, said spacer metal plate having a plurality of spaced apart circuit-receiving apertures therein;

a plurality of planar circuit carriers, one face of each said circuit carriers including a plurality of bonded chip means, each said circuit carrier positioned in a circuit-receiving aperture in said spacer metal plate so as to maintain said bonded chip means in heat exchange contact with a said planar metal plate, regions of said first and second metal plates positioned intermediate said apertures serving as heat dissipation regions, each said planar circuit carrier having a connector region that extends out from between said first metal plate and said spacer metal plate at an extremity of a said circuit receiving aperture; and a circuit card positioned at said extremity and provided with a plurality of interconnection areas, one for each said extended connector region, said circuit card having a major surface positioned parallel to said plates; and means for rigidly connecting said first and second planar metal plates, said spacer metal plate and said circuit card to enable said package to manifest an overall planar and unitary configuration.

2. The high density circuit package as recited in claim 1, wherein each of said first and second planar metal plates and said spacer metal plate have airflow apertures positioned in said heat dissipation regions, so that when said plates are assembled to create a unitary planar-configuration package, the apertures in said plates are both aligned and directly abut one another so as to create airflow passages that enable laminar airflow therethrough.

3. The high density circuit package as recited in claim 2 further comprising a circuit board having a plurality of parallel connectors, each connector positioned to receive and interconnect to a circuit card, said connectors arranged so that each said circuit card, when inserted, positions said airflow apertures co-axially with air flow apertures associated with other circuit cards, whereby non-obstructed air flow through all said co-axially aligned apertures is enabled.

4. The high density circuit package as recited in claim 1, wherein said first and second planar metal plates include airflow passages having a first cross-section and, wherein said spacer metal plate is also provided with airflow apertures, but of a larger cross-section, so that when all said metal plates are sandwiched together, airflow channels are provided with discontinuous inner walls due to the differences in cross section, whereby turbulent airflow is achieved in the interior of said package.

5. The high density circuit package as recited in claim 4 further comprising a circuit board having a plurality of parallel connectors, each connector positioned to receive and interconnect to a circuit card, said connectors arranged so that each said circuit card, when inserted, positions said airflow apertures co-axially with air flow apertures associated with other circuit cards, whereby non-obstructed air flow through all said co-axially aligned apertures is enabled.

6. The high density package as recited in claim 1 further comprising:

a third planar metal plate;

a second metal spacer plate sandwiched between said third planar metal plate and said second planar metal plate; and circuit strips positioned in circuit-receiving apertures in said second metal spacer plates and positioned so that rear aspects of bonded chip means thereon contact said third metal plate.

7. The high density package as recited in claim 3 wherein said package further includes a mirror-image of said first, second, and third planar metal plates and said first and second metal spacer plates, with circuit strips positioned therebetween, said mirror-image plates and circuit carriers positioned back-to-back against said third planar metal plate, and wherein outermost planar plates extend over said circuit card and are fastened thereto so as to create an integral package of said planar metal plates, spacer plates, circuit carriers, and said circuit card.

8. The high density package as recited in claim 7, wherein an exit aperture is provided which communicates with each said circuit receiving aperture, for allowing the connector region of a circuit strip to pass between a respective spacer plate and an abutting planar metal plate and connect to interconnection lands on said circuit card.

9. The high density package as recited in claim 8 wherein the connector regions of circuit strips positioned in one spacer plate extend to one side of said circuit strips, and connector regions of circuit strips contained within a spacer plate in an adjacent layer of the package extend to an opposite side of said circuit strips, whereby all said connector regions are enabled to make connection to one side of said circuit card without mutual interference.

10. The high density package as recited in claim 1 wherein each said circuit strip comprises a flexible elongated sheet, which, in combination with bonded chip means thereon, exhibits a thickness approximately equal to the thickness of a said spacer plate, whereby said sandwiching planar metal plates provide lateral support to said circuit strip and attached chip means.

11. The high density package as recited in claim 1, wherein each said circuit strip comprises a flexible elongated sheet and a plurality of chip means bonded thereon, and further comprising an elastomer sheet positioned between a non-chip means carrying surface of each said circuit strip and an abutting metal plate, so as to provide positional support to said circuit strip.

12. The high density package as recited in claim 1, wherein said planar circuit carrier comprises:

a thin film of insulating material;

conductors positioned on surfaces of said insulating material, said insulating material further provided with apertures at places where a conductor on one surface of said material is to be accessed from a second surface; and solder bumps emplaced at contact points on said conductor on said one side and in said apertures, said solder bumps exhibiting a substantially uniform offset height from said insulating material.

13. The high density package as recited in claim 1, wherein said planar circuit carrier comprises:

a thin film of insulating material;

conductors positioned on surfaces of said insulating material, said insulating material provided with apertures at places where a conductor on one surface of said material is to be accessed from a second surface, said conductor on said one side having interconnection lands for receiving contacts of a component, selected interconnection lands exhibiting a hole that communicates with an aperture in said insulating material; and components having a solder paste on their contacts, mounted on said selected interconnection lands, whereby a reflow operation causes said solder paste to liquify and fill said apertures and holes and interconnect said conductors.

14. The high density package as recited in claim 1, wherein said planar circuit carrier comprises:

a pair of elongated circuit carriers positioned side by side, each carrier exhibiting a image conductor pattern and having contact lands arranged on a common edge, and further having chip means connected to said conductor pattern; and a circuit component having contacts that bridge said contact lands on said circuit carriers and are connected thereto.

15. The high density package as recited in claim 14, wherein each said chip means is a DRAM chip and each said circuit component is a capacitor.

16. The high density package as recited in claim 1, wherein the combination of said first and second planar metal plates, spacer metal plate and planar circuit carriers exhibit an acute angle bend adjacent said circuit card interconnection areas, whereby said combination is bent back upon and is oriented parallel to said circuit carrier.

17. A high density package for a plurality of integrated circuit chips, the combination comprising:

first and second metal plates exhibiting major surfaces;

a planar circuit carrier, one face of said circuit carrier including a plurality of bonded chip means, said circuit carrier positioned between said metal plates so as to create a sandwich structure that enables a face of each said chip means to contact a said metal plate, and having a connector region that extends out from between said metal plates;

pluralities of aligned rows of coolant passages formed in said first and second metal plates so as to pass through a thickness dimension of said sandwich structure and enable coolant to pass therethrough and dissipate heat from said chip means, each said chip means on said planar circuit carrier equidistantly positioned between a pair of rows of said aligned coolant passages; and a circuit card juxtaposed to said connector region and provided with an interconnection area for said connector region, said circuit card having a major surface positioned parallel to said plates; and means for rigidly coupling said first and second metal plates and said circuit card to create a package that presents an overall planar configuration.

18. The high density package as recited in claim 17, wherein said aligned coolant passages are positioned about a periphery of said planar circuit carrier.

19. The high density packages recited in claim 18, wherein said package includes a plurality of planar current carriers mounted between said metal plates, said circuit card provided with an interconnection area for each said carrier.

20. The high density package as recited in claim 19 further comprising:

a spacer plate positioned between said metal plates, having corresponding passages therein that are aligned with the aligned coolant passages in said metal plates, said spacer plate provided with a plurality of apertures for receiving said circuit carriers.

21. The high density package as recited in claim 17 further comprising:

a mother card having connectors receiving a plurality of said circuit cards, so that major surfaces of said metal plates are in contact and said aligned coolant passages therein are aligned.

22. The high density package as recited in claim 17, in combination with:

at least one other of said high density packages, said high density packages being aligned with each other in parallel so that said aligned coolant passages of successive high density packages are aligned with one another so as to enable coolant to pass through said aligned coolant passages of said successive high density packages.

23. The high density package as recited in claim 17, in combination with:

a plurality of members arranged so as to form channels between said members, said channels being aligned with said aligned coolant passages.

24. The combination of claim 23 further comprising: means for causing coolant to move along said channels and through said aligned coolant passages.

25. The combination of claim 23 wherein said members are battery packs for supplying back up power for said integrated circuit chips of said high density packages.

26. The combination of claim 23, further comprising:

at least one other of said high density packages, said high density packages being aligned with each other in parallel so that said aligned coolant passages of successive high density packages are aligned with one another so as to enable coolant to pass through said aligned coolant passages of said successive high density packages.

* * * * *